US008996946B2

(12) United States Patent
Wu

(10) Patent No.: US 8,996,946 B2
(45) Date of Patent: Mar. 31, 2015

(54) APPLICATION OF FOUNTAIN FORWARD ERROR CORRECTION CODES IN MULTI-LINK MULTI-PATH MOBILE NETWORKS

(75) Inventor: Zhenyu Wu, Plainsboro, NJ (US)

(73) Assignee: Thomson Licensing, Issy Les Moulineaux (FR)

( * ) Notice: Subject to any disclaimer, the term of this patent is extended or adjusted under 35 U.S.C. 154(b) by 241 days.

(21) Appl. No.: 13/514,400

(22) PCT Filed: Dec. 9, 2009

(86) PCT No.: PCT/US2009/006466
§ 371 (c)(1),
(2), (4) Date: Jun. 7, 2012

(87) PCT Pub. No.: WO2011/071472
PCT Pub. Date: Jun. 16, 2011

(65) Prior Publication Data
US 2012/0246538 A1   Sep. 27, 2012

(51) Int. Cl.
*H03M 13/47* (2006.01)
*H04L 1/06* (2006.01)
*H03M 13/37* (2006.01)
*H04L 1/00* (2006.01)
*H03M 13/53* (2006.01)

(52) U.S. Cl.
CPC ............ *H04L 1/06* (2013.01); *H03M 13/3761* (2013.01); *H04L 1/0057* (2013.01); *H04L 1/007* (2013.01); *H04L 2001/0096* (2013.01); *H04L 2001/0098* (2013.01)
USPC ......................................... 714/752; 714/800

(58) Field of Classification Search
CPC ... H04L 1/0057; H04L 1/0045; H04L 1/1887; H04L 1/0061; H03M 13/116; H03M 13/09; G06F 11/10
See application file for complete search history.

(56) References Cited

U.S. PATENT DOCUMENTS

| 7,924,761 | B1 * | 4/2011 | Stevens ........................ 370/315 |
| 2006/0062243 | A1 | 3/2006 | Dacosta |
| 2009/0080510 | A1 * | 3/2009 | Wiegand et al. ......... 375/240.01 |

FOREIGN PATENT DOCUMENTS

WO   WO2006104517   10/2006

OTHER PUBLICATIONS

Han et al., "Path Virtualization Using Fountain Code for Viudeo Streaming over Heterogeneous Networks," Int'l. Conference on Intelligent Information Hiding and Multimedia Signal Processing, 2008 (IIHMSP '08), IEEE Aug. 15, 2008, pp. 810-813.
Jurca et al., "Forward Error Correction for Multipath Media Streaming," IEEE Transactions on Circuits and Systems for Video Technology, vol. 19, No. 9, Sep. 1, 2009, pp. 1315-1326.
Sejdinovic et al., "Expanding Window Fountain Codes for Unequal Error Protection," IEEE Transactions on Communications, vol. 57, No. 9, Sep. 1, 2009, pp. 2510-2516.
Search Report Dated Aug. 26, 2010.

* cited by examiner

*Primary Examiner* — April Y Blair
*Assistant Examiner* — Dipakkumar Gandhi
(74) *Attorney, Agent, or Firm* — Robert D. Shedd; Jerome G. Schaefer

(57) ABSTRACT

A method and apparatus are described including receiving content, applying fountain codes to symbols of the content to generate fountain encoded symbols at one of a transport layer and an application layer and transmitting the generated fountain encode symbols via a mobile network that uses a multi-link delivery system. Also described are a method and apparatus including receiving data packets of fountain encoded symbols via a mobile network that uses a multi-link delivery system, decoding the received data packets of fountain encoded symbols to content data, attempting to recover any corrupted content data and determining if the content data was recovered.

9 Claims, 6 Drawing Sheets

APPLICATION OF FOUNTAIN FORWARD ERROR CORRECTION CODES IN MULTI-LINK MULTI-PATH MOBILE NETWORKS

This application claims the benefit, under 35 U.S.C. §365 of International Application PCT/US2009/006466, filed Dec. 9, 2009, which was published in accordance with PCT Article 21(2) on Jun. 16, 2011 in English.

FIELD OF THE INVENTION

The present invention relates to multi-link multi-path mobile networks, and in particular, to the use of fountain (rateless) forward error correction (FEC) codes to those multi-link multi-path mobile networks.

BACKGROUND OF THE INVENTION

In mobile networks that employ a multi-link/multi-path delivery mechanism, content is transmitted through multiple network links/paths to end user terminals. To improve system throughput when channel impairment exists, forward error correction (FEC) techniques are often applied to recover lost data during transmission.

Herein, the terms "content", "data" or "content data" refer to the data that is needed by a user service, and the terms "parity symbols" or "parity data" refer to the redundant data generated by an FEC encoder to protect the content data. Traditional FEC codes, for example, parameterized error correcting codes (such as BCH codes), Reed-Solomon, low density parity check codes (LDPC), etc. can be applied to mobile networks that employ multi-link/multi-path delivery mechanisms in order to recover data lost during transmission. Traditional FEC codes, however, suffer the following problems when used in multi-link/multi-path mobile networks:

1. These codes are fixed pre-determined rate codes, i.e., the number of parity symbols in each codeword is determined prior to FEC encoding. The code rate determines the maximum data recovery capability. Thus, if the amount of content data lost during delivery exceeds the maximum recovery capability determined by the code rate, FEC decoding generally fails and very little if any lost data can be recovered. This problem is more pervasive in mobile networks because the underlying wireless channel conditions in a mobile network can vary over a wide range over time, thus making it difficult to predetermine a proper FEC code rate.

2. The receiver has to receive a proper set of content and parity data to be able to perform FEC decoding. Consider the case in which content and panty data from a source are sent over multiple paths from the server to the receiver. Specifically, the server divides the total data into subsets and sends each subset over one of the multiple paths. There are two ways to distribute the data: (1) each subset of content data and parity data is disjoint from each other subset of content data and parity data; and (2) a subset of content data and parity data contains some duplicate data from another subset of content data and parity data.

In the first situation, the data redundancy (or equivalently FEC protection) is only determined by the FEC code rate. Thus, the server has to know each path's channel characteristics. Only with the channel condition knowledge, is the server able to determine an appropriate FEC code rate, so that the code rate is sufficient to overcome the aggregated data losses from multiple paths and meanwhile attempt to keep the channel encoding/decoding complexity low. Multiple network links (paths) may be dynamic or overlapping. Obviously, such knowledge can be difficult, if not impossible, to obtain in an aggregated network delivery scenario. A common approach is to choose a low code rate that targets the worst channel condition. Although this approach minimizes the probability of FEC decoding failure, it may decrease FEC protection efficiency for those receivers with milder channel conditions. In addition, a low code rate usually increases the FEC encoding complexity at the server side and may increase the FEC decoding complexity at the receiver side. The latter factor is especially undesirable since a mobile receiver is often power and complexity constrained.

In the second situation, some duplicate data are sent over different paths to the receiver. This approach can flexibly adjust data redundancy while not running into the problem of deciding a code rate a priori. However, in this case, identical copies of content or parity data may arrive at the receiver from different paths. When this occurs, the receiver has to discard the duplicate copies because the duplicate packets are not useful in recovering content data using traditional FEC codes. Hence, this approach may lead to a waste of network bandwidth as well as increased complexity and overhead in the receiver.

When a fountain based FEC code is applied to multi-path mobile network applications, as traditional FEC codes, its encoded symbols are encapsulated into data packets and sent over multiple paths to the receiver. In turn, the receiver performs fountain FEC decoding to recover content data based on received data. However, depending upon the number of fountain based FEC codes that arrive at the receiver, the encoded fountain symbols with different edge degrees have different capabilities in recovering content data symbols. Consider, for example, when only a fraction of a fountain codeword arrives at the receiver so that complete data recovery is not possible. In this case, if the received coded data symbols have undesirable edge degrees, the receiver can recover only a minimal number of content data symbols. A possible remedy to the problem is to introduce some packet scheduling mechanism which coordinates data over multiple paths so that they do not overlap at the receiver. However, such solution often requires stringent receiver feedback and may also increase system complexity and decrease system throughput.

Content data often has inherent differences in importance with respect to user service experiences. For example, in video streaming applications, certain coded frames are more important than others to reconstruct the original video. When simply applying a fountain FEC code to protect user data, the FEC protection profile generally does not match the importance profile of the content data. As a result, when complete content data recovery is not possible, more important content data suffers the same loss rates as the less important ones. This results in QoS degradation that affects user viewing experiences.

SUMMARY OF THE INVENTION

The present invention describes the application of a type of forward error correction codes, namely fountain codes, to mobile networks that employ the multi-link/multi-path system paradigm. The present invention further describes two schemes of delivery and encoding of fountain codes. The selected delivery schemes maximize system throughput and improving end user's quality of services (QoS).

A method and apparatus are described including receiving content, applying fountain codes to symbols of the content to generate fountain encoded symbols at one of a transport layer and an application layer and transmitting the generated fountain encode symbols via a mobile network that uses a multi-link delivery system. Also described are a method and apparatus including receiving data packets of fountain encoded symbols via a mobile network that uses a multi-link delivery system, decoding the received data packets of fountain encoded symbols to content data, attempting to recover any corrupted content data and determining if the content data was recovered.

BRIEF DESCRIPTION OF THE DRAWINGS

The present invention is best understood from the following detailed description when read in conjunction with the accompanying drawings. The drawings include the following figures briefly described below.

DETAILED DESCRIPTION OF THE PREFERRED EMBODIMENTS

The generation of fountain encoded symbols for a block of content data includes two steps. First, the fountain encoder draws a pseudo-random number d from some a priori known distribution $\Omega$ over positive integers. Given the number d, the server then randomly selects d distinctive data units from the content data block. These d data units are XORed to form an encoded fountain symbol. For each encoded fountain symbol, the number d is called its edge degree. The decoding of fountain codes can be based on brief-propagation algorithm, maximum-likelihood decoding, etc.

Fountain codes are a class of erasure codes that are rateless. Specifically, fountain codes can generate an arbitrary number of encoded symbols, from a few to possibly an infinite number, for each codeword on the fly, where herein a codeword refers to a block of output symbols including information regarding the message bytes and the generated parity bytes as the output of a block-based FEC encoder. Thus, unlike traditional FEC codes, the code rate for a fountain code is no longer fixed. On the other hand, a fountain decoder can recover the content data from any set of encoded symbols of a codeword, as long as sufficient encoded symbols are received. Therefore, regardless of the loss rate of a communication channel, the fountain encoder can simply keep generating and sending encoded symbols, until the fountain decoder has received enough encoded symbols for recovery.

Fountain codes are universal in the sense that at any channel loss rate, fountain codes can achieve channel capacity asymptotically as the data length grows. It is known that for a given loss rate, very little extra parity data is necessary for successful recovery, compared to an ideal FEC code designed just for that loss rate. Fountain code families include LT-codes, Raptor codes, etc. Fountain codes have been proposed for a number of network applications, for example, relay networks, peer-to-peer networks etc.

Described herein is the application of fountain code to mobile networks that employ the multi-link/multi-path delivery mechanism.

Figure 1:
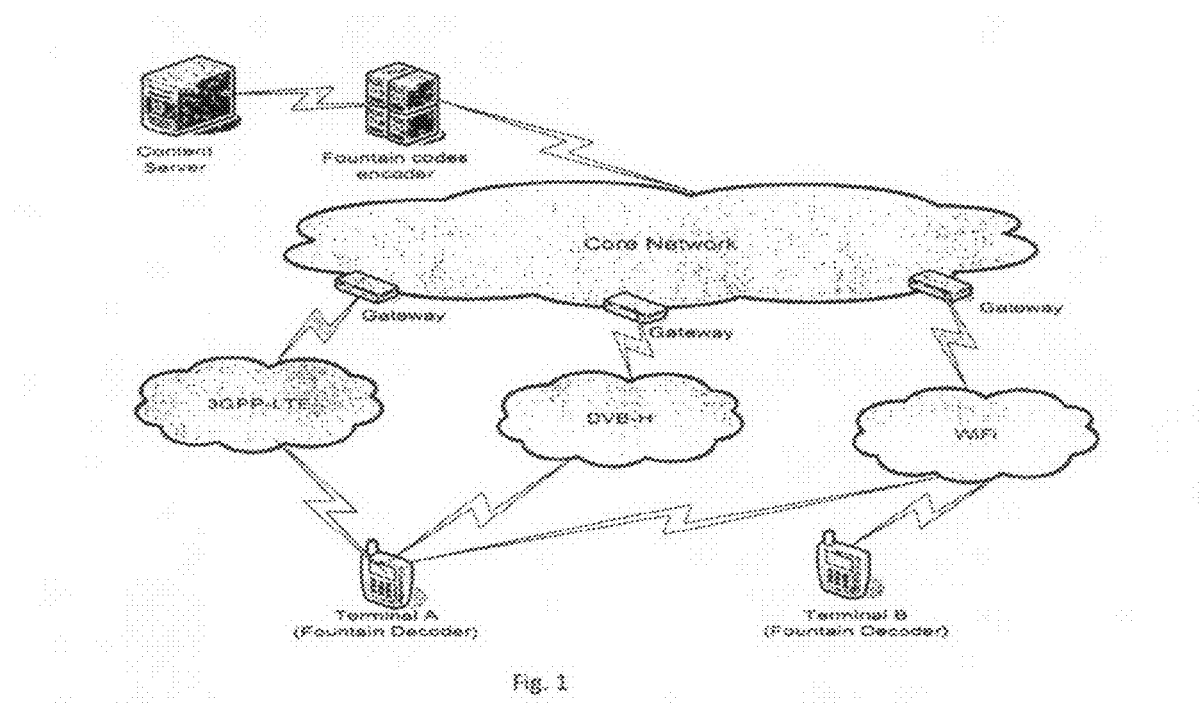
FIG. 1 is a system level schematic diagram of a mobile network configured with a fountain FEC encoder and receiving mobile terminals having fountain FEC decoders.

FIG. 1 is a system level schematic diagram of multi-link/multi-path mobile networks that employ fountain codes. In FIG. 1 the content server is connected to the fountain codes encoder, and the latter is connected to the core network. The core network has several access points (gateways) connecting to several mobile access networks, such as a Third Generation Partnership Project—Long Term Evolution (3GPP-LTE) cellular network, a Digital Video Broadcasting—Handheld (DVB-H) network, and a WiFi network. Each mobile terminal has several network interfaces so that it can concurrently connect to multiple access networks. Thus, when the mobile terminal is within a common service area of multiple networks, it can choose to connect to more than one network to create multiple concurrent delivery paths linking from/to the server. It is also assumed that each mobile terminal (receiver) is equipped with a fountain decoder.

The data delivery process starts at the content server. The content server first sends content data to the fountain encoder. The fountain encoder takes one block of received content data, generates encoded symbols and sends them to the core network. For each block, the fountain encoder keeps generating encoded symbols until a predetermined time schedule or data quantity is reached or an explicit feedback message from the mobile terminal is received that indicates no more symbols are needed in order to decode and recover the block of content data. Then the fountain encoder moves to the next block of content data and repeats the process.

The encoded symbols output from the fountain encoder are encapsulated into data packets and transmitted to the core network. Via the transmission process, the fountain encoder designates a destination access network for each data packet. To improve system performance, the designation decision can take into account certain network link quality metrics with respect to receiving mobile terminals, for example, bandwidth, loss rate, delay and jitter, etc. Such information can be obtained by mechanisms such as the IEEE 802.21 (MIH) standard. The data packets are then delivered by the core network to their respective destination networks through corresponding gateway interfaces.

For a unicast application, only one mobile terminal receives data packets, for example, Terminal A in the figure. The mobile terminal takes data packets from the access networks it connects to on a block by block, where a block refers to the encoded symbols generated by the Fountain encoder for each block of content data. (or equivalently, codeword by codeword) basis. For each block, reception is complete when (1) a sufficient number of encoded symbols have been received by the mobile terminal (receiver) for successful fountain code FEC decoding, or (2) the time schedule to receive the block of content data has expired. If a feedback channel is available, the mobile terminal can optionally send a message back to the fountain encoder to indicate current status regarding the received data. The mobile terminal, in turn, performs fountain decoding to recover any lost or corrupted content data.

For a multicast application, multiple mobile terminals receive the same fountain encoded data packets (packetized fountain encoded symbols) from the server (via the fountain encoder) in a session, for example, Terminals A and B in the figure. Each mobile terminal performs the same operations as it does in the unicast case.

Figure 2:
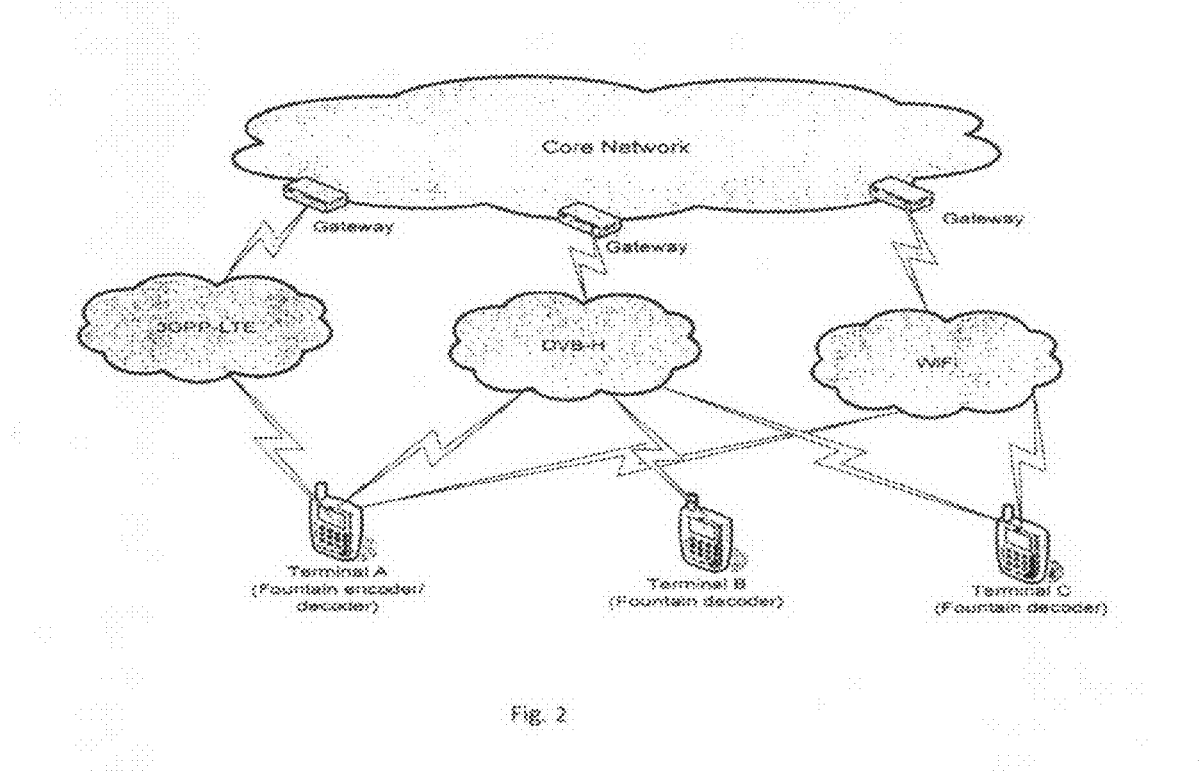
FIG. 2 is another system level schematic diagram of a mobile network configured with a sending mobile terminal having a fountain FEC encoder and receiving mobile terminals having fountain FEC decoders.

FIG. 2 is another system diagram that shows the exploitation of fountain codes in multi-link/multi-path mobile networks. In FIG. 2 a terminal (for example Terminal A) has content data to be unicast or multicast to other mobile terminals (for example, Terminals B and C). Each mobile terminal can have multiple access network connections. The system operates similarly to the mobile networks in FIG. 1, except now Terminal A acts as the content server as well as the fountain encoder in FIG. 1. That is, the roles of server and receiver have been reversed.

Fountain codes can provide the following advantages in the diagrams.

With the rateless property, the fountain encoder does not have to predetermine a code rate for encoding. The fountain FEC encoder does not need to know the link quality information for the purpose of fountain FEC encoding. This is important because in a dynamically changing environment such as multi-link mobile networks, such information may be hard to obtain accurately. Meanwhile, employing fountain FEC encoding/decoding also avoids targeting the FEC code rate to the worst channel condition. This leads to possible complexity savings at both the fountain FEC encoder and decoder, which is crucial for mobile applications.

With the randomness property, the fountain decoder is able to successfully decode and recover content data with an arbitrary set of encoded symbols. With this property, the fountain encoder can simply distribute the data packets that contain encoded symbols in disjoint sets to different access networks. That means the server and fountain encoder can be spared the additional overhead of a packet scheduling mechanism to avoid duplicated data, which may require detailed knowledge about the terminals' connection configurations. This scheme makes it possible to achieve high system throughput efficiently in a dynamic system such as multi-path mobile networks.

The present invention uses an optimized delivery scheme of fountain symbols to improve system throughput. Let R represent the number of encoded fountain symbols that arrive at a mobile terminal. It has been shown that for each R, that the probability of recovering content data is different for the encoded symbols with different edge degree d. Therefore, there is an optimum edge degree d of encoded fountain symbols that maximizes data recovery probability for each R. More specifically, when R is small, fountain encoded symbols with a small edge degree d are preferred. As R increases, fountain encoded symbols with a larger degree d are more likely to recover content data. Meanwhile, in a multi-link mobile networks system, different network paths may exhibit different link qualities, such as bandwidth, data loss rates, delay, jitter, etc.

It is possible to combine the above two properties, i.e., the ratelessness and randomness, (to improve system throughput. Specifically, during the delivery stage of each fountain encoded symbol block, the fountain encoder can designate those encoded symbols with smaller edge degrees to the access networks with shorter delay and/or lower data losses. Similarly, those encoded symbols with greater edge degrees can be designated for delivery to the networks with longer delays and/or more data losses. With the approach of the present invention, for each data block, a receiving terminal is assured of receiving encoded symbols with smaller edge degrees first and encoded symbols with larger edge degrees latter. When the mobile terminal stops receiving data before enough encoded symbols have arrived to ensure decoding and recovery of all content data, with the approach of the present invention, the set of received encoded symbols can recover more content data than the case where encoded symbols are distributed randomly regardless of their edge degrees. Thus, the system throughput can be improved.

The scheme can be further refined when the mobile terminal sends feedback to the fountain encoder. In this case, the mobile terminal can inform the fountain encoder regarding the number of the encoded symbols it has received. Based on the information provided by the mobile terminal, the fountain encoder can deduce the content data recovery probability for each edge degree d. Then the fountain encoder can generate the encoded symbols with desired edge degrees and update the configuration of packet destination networks, thus improve the mobile terminal's data recovery probability.

Figure 3:
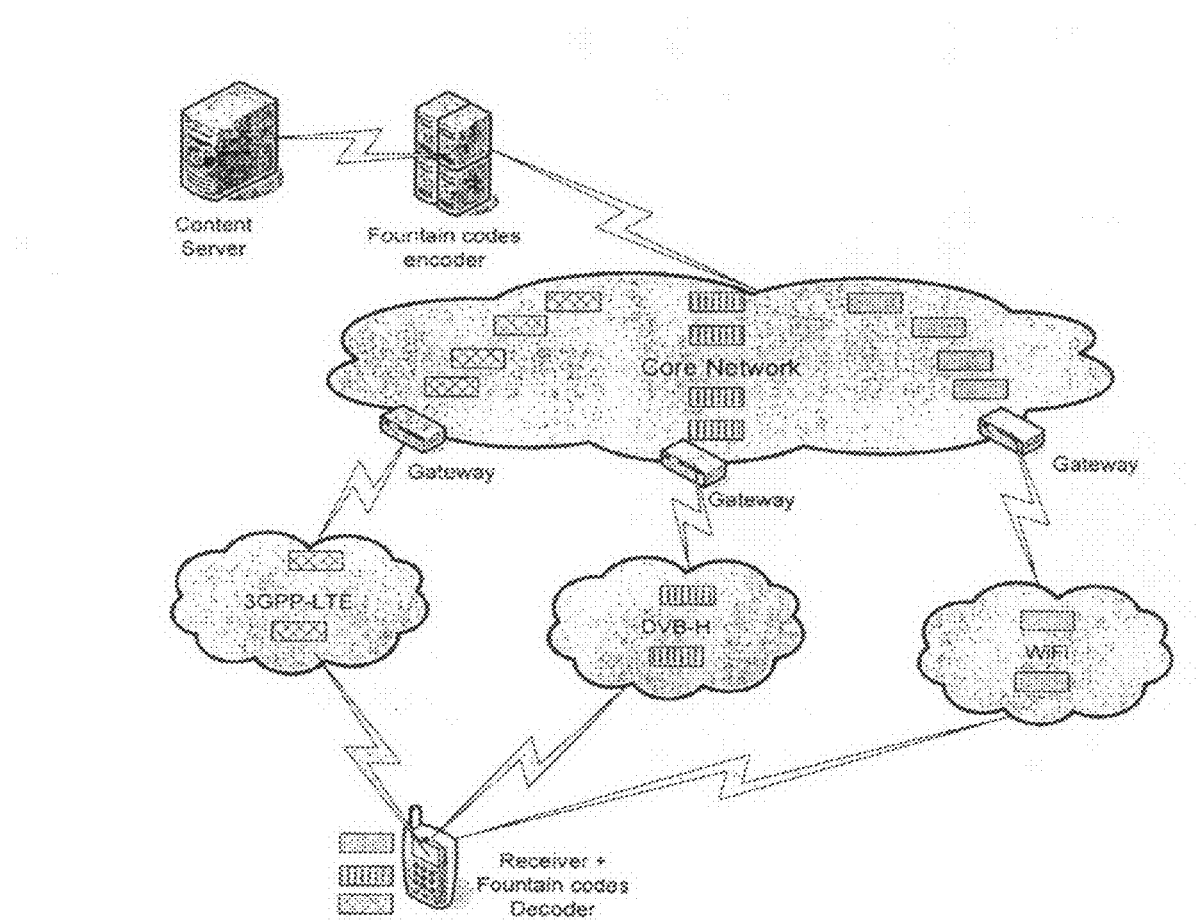
FIG. 3 is a system level schematic diagram of a mobile network configured with a fountain FEC encoder and receiving mobile terminals having fountain FEC decoders showing disjoint sets of data packets going to designated mobile access networks.

In FIG. 3, the rectangular blocks with different shading represent data packets with encoded symbols of different edge degrees. Suppose in FIG. 3 the WiFi, DVB-H and 3GPP-LTE networks have different link qualities and the fountain encoder has that information. Then the fountain encoder can optimally generate encoded fountain symbols with desirable edge degrees and designate them optimally to their corresponding destination networks. As the result, the mobile terminal can recover a maximum amount of lost content data, given the number of encoded symbols received.

The present invention uses an optimized delivery/coding scheme of fountain codes to exploit differential protection. Content data delivered to a mobile terminal usually has inherent differences in importance with respect to their service. This feature entails differential protection so that more important data gets more protection and vice versa. It is well known that such an approach can provide graceful quality degradation and improved QoS.

In a multi-link/multi-path network system, multiple network paths may have different link qualities, which lead to different data loss rates. Furthermore, if certain FEC codes are employed, they can usually provide different data protection as well.

The first realization of differential protection is through the multi-link/multi-path mechanism. For content data either coded or not by an FEC code, the more important data can be sent through the network paths with smaller data loss rates and/or shorter delays. On the other hand, less important data can be sent though the network paths with higher loss rates and/or longer delay.

The second realization is through fountain FEC encoding. It has been shown that in a fountain codeword, the input nodes that have more edges to the output nodes have greater recovery probability than the ones that have fewer edges. This property can be used to enable differential protection using fountain codes.

Figure 4:
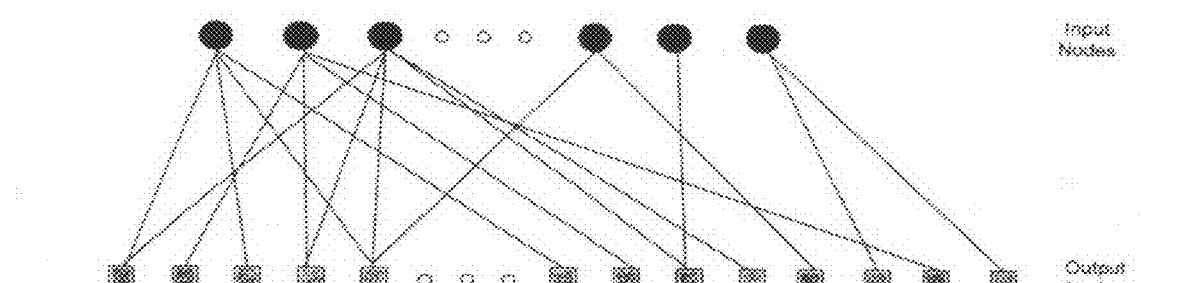
FIG. 4 is a bipartite graph of fountain code edge connections.

As an example, FIG. 4 shows a bipartite graph representation of a fountain code's edge connections. The circles in the figure represent input nodes, which correspond to the content data input to the fountain FEC encoder. The squares in the figure represent output nodes, which correspond to the encoded symbols output from the fountain FEC encoder. The links between the input nodes and the output nodes are edges, and the number of edges of each input or output node is the degree of the node. In FIG. 4, the three input nodes on the left have larger edge degrees than the three on the right. So the left three input nodes have higher recovery probability than the right three nodes, if the output nodes are subject to the same loss rate. Looking at the leftmost input node, it has a degree of three. Looking at the leftmost output node, it has a degree of two. Input node edge degree and output node edge degree is not necessarily the same.

The second realization exploits the above property to form differential protection, the fountain encoder can encode the more important content data using the input nodes with larger edge degrees and correspondingly encoding the less important content data as input nodes with smaller edge degrees.

Figure 5:
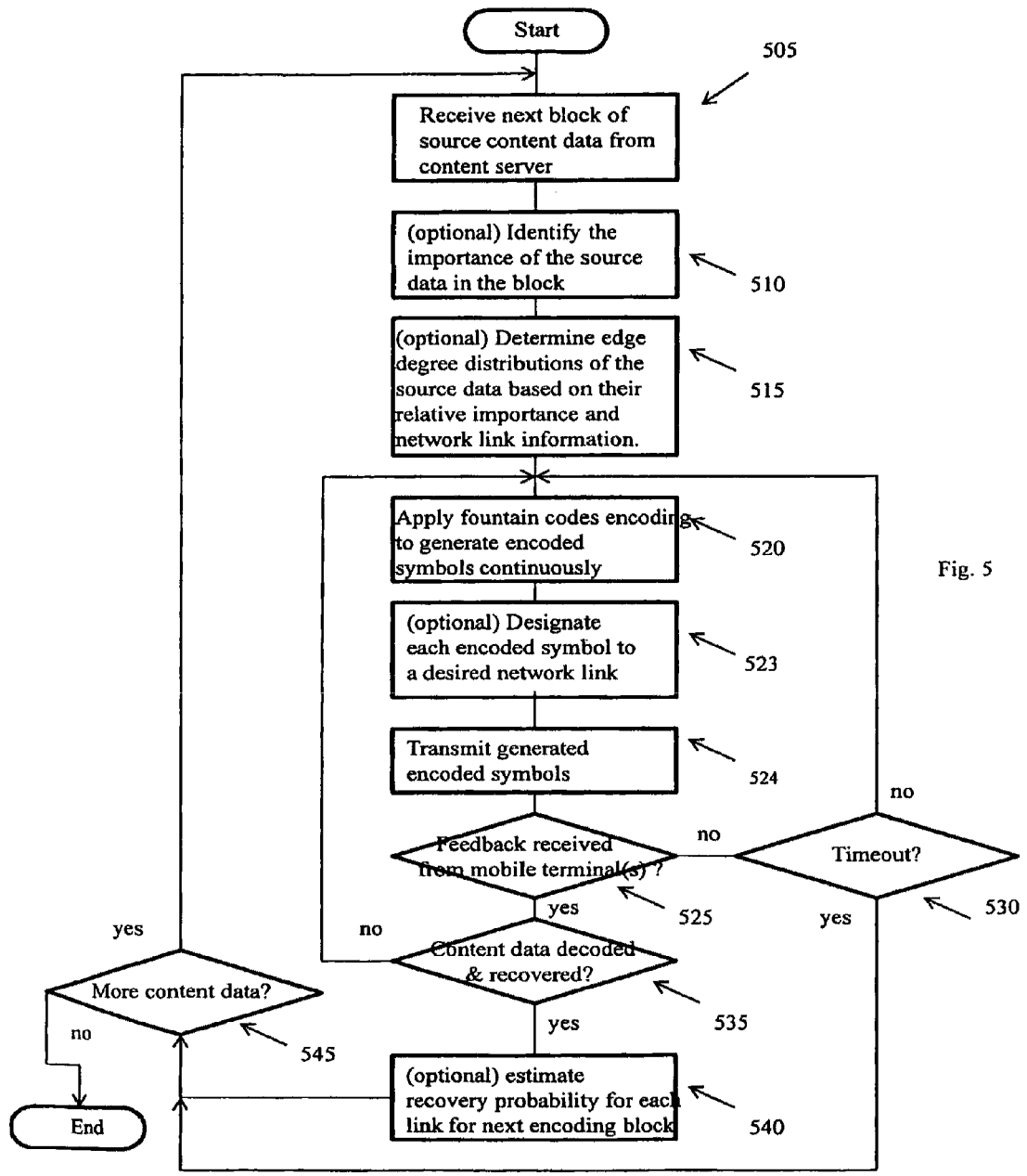
FIG. 5 is a flowchart of an exemplary embodiment of a fountain encoder in accordance with the principles of the present invention.

FIG. 5 is a flowchart of an exemplary embodiment of a fountain encoder in accordance with the principles of the present invention. At 505 the fountain encoder receives a block of content data from a content server. The fountain encoder may, in fact, receive content from a plurality of content servers. Next, at 510, the fountain encoder optionally identifies the importance of the source data in the block. At 515, optionally, the fountain encoder determines edge degree distributions (to paths of the multiple access networks via the core network and the gateway interfaces) of the source data based on their relative importance and network link quality information and conditions. At 520 the fountain encoder applies fountain FEC coding to the content data to generate fountain encoded symbols. At 523 the fountain encoder optionally designates each block (codeword) of fountain encoded symbols to the desired network links (paths of the multiple access networks via the core network and the gateway interfaces). At 524 the fountain encoded symbols are transmitted over the multiple access networks via the core network and the gateway interfaces. A test is performed at 525 to determine if feedback has been received from the mobile terminal(s). If feedback has been received from the mobile terminal(s) then at 535 a test is performed to determine if the mobile terminal(s) report that the content data has been decoded and recovered. If the mobile terminal(s) report that the content data has been decoded and recovered then at 540 the fountain encoder optionally estimates the content recovery probability for each edge (link) for the next block of encoded symbols. At 545 the fountain decoder performs a test at 545 to determine if there is more content data. If there is more content data then processing continues at 505. If the mobile terminal(s) report that the content data has not been decoded and recovered then processing continues at 520. If feedback has not been received from the mobile terminal(s) then the fountain encoder performs a test at 530 to determine if a timeout (for the transmission and receipt ((and decoding and recovery) of content data has occurred. If a timeout (for the transmission and receipt ((and decoding and recovery)) of content data has occurred then processing continues at 545. If a timeout (for the transmission and receipt ((and decoding and recovery) of content data has not occurred then processing continues at 520.

Figure 6:
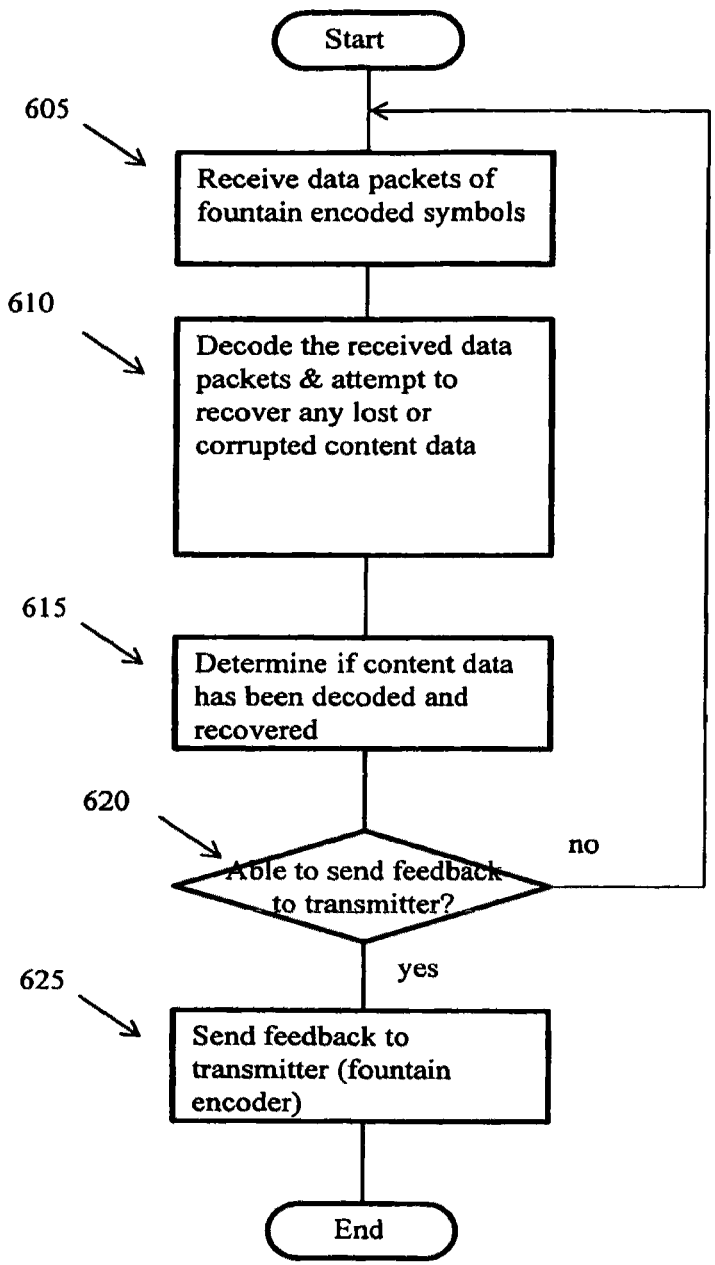
FIG. 6 is a flowchart of an exemplary embodiment of a fountain decoder in accordance with the principles of the present invention.

FIG. 6 is a flowchart of an exemplary embodiment of a fountain decoder in accordance with the principles of the present invention. At 605 the fountain decoder receives data packets of fountain encoded symbols. At 610 the fountain decoder decodes the received data packets and attempts to recover any lost or corrupted content data. At 615 the fountain decoder determines if the content data has been decoded and any lost or corrupted content data recovered. At 620 a test is performed to determine if the fountain decoder is able to send feedback to the transmitter. If the fountain decoder is able to send feedback to the transmitter then at 625 the fountain decoder sends feedback to the transmitter (fountain encoder). If the fountain decoder is not able to send feedback to the transmitter then processing continues at 605.

Figure 7:
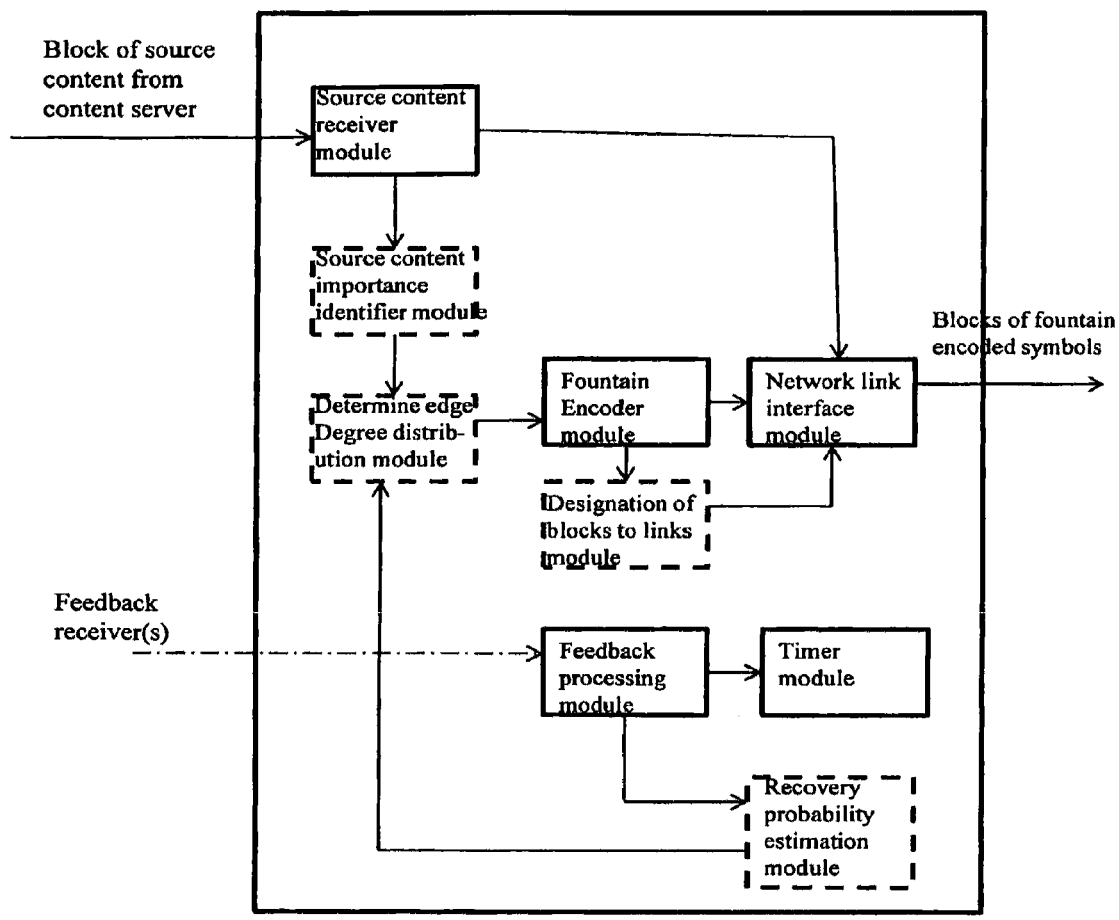
FIG. 7 is a block diagram of an exemplary embodiment of a fountain encoder in accordance with the principles of the present invention.

FIG. 7 is a block diagram of an exemplary embodiment of a fountain encoder. There may be greater or fewer modules than depicted. The modules depicted are by functionality and may be split or combined in any given implementation The fountain encoder may be implemented in hardware, software or firmware or any combination thereof and may or may not include reduced instruction set computers (RISCs), application specific integrated circuits (ASICs) and/or field programmable gate arrays (FPGAs) or any combination thereof. A receiver module receives the blocks of source content from one or more content servers. Optionally, a source content importance identifier module determines the importance of the source content to provide differential protection. Optionally a determine edge degree distribution module determines the edge degree distribution. The fountain encoder module receives input from either the source content receiver module or the determine edge degree distribution module and applies fountain codes to the source content. Optionally the fountain encoder module provides the fountain encoded symbols to a designation of blocks to links module. If the blocks of fountain encoded symbols are designated to blocks randomly as opposed to based on importance then the fountain encoder module provides the fountain encoded symbols to the network link interface module for packetization and transmission to the various multiple access networks via the core network and gateway interfaces. If feedback is available from the receivers then such feedback is received and processed by the feedback processing module which also determines if the fountain decoder decoded and recovered the source content. Optionally the recovery probability estimation module estimates the recovery probability for each link and provides that estimation to the determine edge degree distributions module. The timer module determines if a timeout has occurred if no feedback was timely received.

Figure 8:
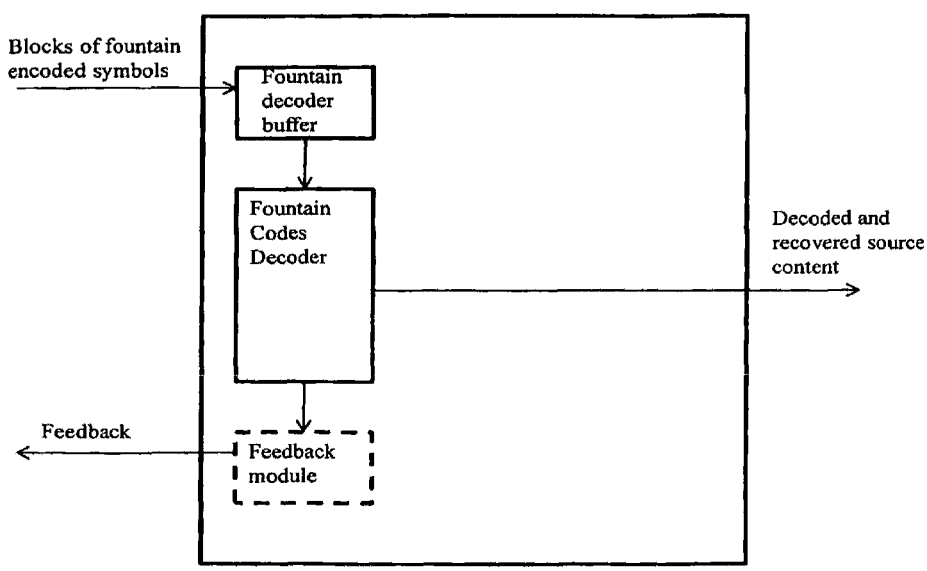
FIG. 8 is a block diagram of an exemplary embodiment of a fountain decoder in accordance with the principles of the present invention.

FIG. 8 is a block diagram of an exemplary embodiment of a fountain decoder. There may be greater or fewer modules than depicted. The modules depicted are by functionality and may be split or combined in any given implementation The fountain encoder may be implemented in hardware, software or firmware or any combination thereof and may or may not include reduced instruction set computers (RISCs), application specific integrated circuits (ASICs) and/or field programmable gate arrays (FPGAs) or any combination thereof. A fountain decoder buffer receives the blocks of fountain encoded symbols (packetized) from various access networks via the core network and the gateway interfaces. The fountain decoder buffer provides the fountain encoded symbols to the fountain codes decoder module, which decodes and recovers the source content. The recovered source content is provided to other equipment which ultimately renders the source content. The fountain codes decoder module optionally provides information to the feedback module (if such exists) which provides feedback to the fountain encoder via the multiple access networks via the core network and the gateway interfaces.

It is to be understood that the present invention may be implemented in various forms of hardware, software, firmware, special purpose processors, or a combination thereof. Preferably, the present invention is implemented as a combination of hardware and software. Moreover, the software is preferably implemented as an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and microinstruction code. The various processes and functions described herein may either be part of the microinstruction code or part of the application program (or a combination thereof), which is executed via the operating system. In addition, various other peripheral devices may be connected to the computer platform such as an additional data storage device and a printing device.

It is to be further understood that, because some of the constituent system components and method steps depicted in the accompanying figures are preferably implemented in software, the actual connections between the system components (or the process steps) may differ depending upon the manner in which the present invention is programmed. Given the teachings herein, one of ordinary skill in the related art will be able to contemplate these and similar implementations or configurations of the present invention.

The invention claimed is:

1. A method comprising the steps of:
applying fountain codes to symbols of a content to generate a first set and a second set of fountain encoded symbols; and
transmitting the first set and the second set of generated fountain encoded symbols via a multi-link network, wherein the first set of generated fountain encoded symbols having a smaller number of edge degrees than the second set of generated fountain encoded symbols, and the first set of generated fountain encoded symbols are transmitted over a first network link having a shorter delay and lower data loss than a second network link used to transmit the second set of generated fountain encoded symbols.

2. The method of claim 1 further comprising:
receiving feedback;
determining whether the content has been decoded and recovered responsive to said received feedback; and
determining whether a timer for transmitting the generated fountain encoded symbols has expired.

3. The method of claim 1, further comprising estimating a recovery probability for each network link for a next unit of the generated fountain encoded symbols.

4. The method of claim 1 wherein the first set is disjoint from the second set.

5. A method comprising the steps of:
receiving a content; and
applying fountain codes to symbols of the content to generate a first set and a second set of fountain encoded symbols, wherein the first set of generated fountain encoded symbols having a greater importance than the second set of generated fountain encoded symbols, and the first set of generated fountain encoded symbols are encoded with fountain codes using a first set of input nodes having a larger number of edge degrees than a second set of input nodes used to encode the second set of generated fountain encoded symbols.

6. An apparatus comprising:
a fountain code module for applying fountain codes to symbols of a content to generate a first set and a second set of fountain encoded symbols; and
a network interface module for transmitting the first set and the second set of generated fountain encoded symbols via a multi-link network, wherein the first set of generated fountain encoded symbols having a smaller number of edge degrees than the second set of generated fountain encoded symbols, and the first set of generated fountain encoded symbols are transmitted over a first network link having a shorter delay and lower data loss than a second network link used to transmit the second set of generated fountain encoded symbols.

7. The apparatus of claim 6 further comprising:
a feedback processing module for receiving feedback and for determining whether the content has been decoded and recovered responsive to said received feedback.

8. The apparatus of claim 6, further comprising
a timing module for determining whether a timer for transmitting the generated fountain encoded symbols has expired.

9. The apparatus of claim 6 further comprising a module for estimating a recovery probability for each network link for a next unit of the generated fountain encoded symbols.

* * * * *